(12) United States Patent
Hinzpeter et al.

(10) Patent No.: US 7,158,378 B2
(45) Date of Patent: Jan. 2, 2007

(54) SWITCH CABINET FOR A TABLET PRESS

(75) Inventors: Jürgen Hinzpeter, Schwarzenbek (DE);
Ingo Schmidt, Schwarzenbek (DE);
Werner Seifert, Wentorf (DE);
Alexander Oldenberg, Dassendorf (DE)

(73) Assignee: Fette GmbH, Schwarzenbek (DE)

( * ) Notice: Subject to any disclaimer, the term of this patent is extended or adjusted under 35 U.S.C. 154(b) by 309 days.

(21) Appl. No.: 10/872,188

(22) Filed: Jun. 17, 2004

(65) Prior Publication Data
US 2005/0280989 A1 Dec. 22, 2005

(51) Int. Cl.
H05K 7/20 (2006.01)
F24F 7/007 (2006.01)
B30B 1/04 (2006.01)

(52) U.S. Cl. .................. 361/695; 361/690; 454/186
(58) Field of Classification Search ................ 361/688, 361/690, 695; 454/184–186; 312/236
See application file for complete search history.

(56) References Cited

U.S. PATENT DOCUMENTS

| | | | | |
|---|---|---|---|---|
| 4,126,269 A | * | 11/1978 | Bruges | 236/49.3 |
| 4,817,006 A | * | 3/1989 | Lewis | 700/206 |
| 5,150,277 A | * | 9/1992 | Bainbridge et al. | 361/695 |
| 5,788,467 A | * | 8/1998 | Zenitani et al. | 417/360 |
| 6,104,003 A | * | 8/2000 | Jones | 219/400 |
| 6,164,369 A | * | 12/2000 | Stoller | 165/104.33 |
| 6,776,707 B1 | * | 8/2004 | Koplin | 454/184 |
| 6,788,535 B1 | * | 9/2004 | Dodgen et al. | 361/695 |

FOREIGN PATENT DOCUMENTS

| | | |
|---|---|---|
| DE | 28 13 682 | 4/1979 |
| DE | 28 446 72 A1 | 4/1980 |
| DE | 195 15 121 A1 | 10/1996 |
| DE | 196 23 677 C2 | 12/1997 |
| DE | 298 23 425 U1 | 8/1999 |

(Continued)

Primary Examiner—Anatoly Vortman
(74) Attorney, Agent, or Firm—Vidas, Arrett & Steinkraus, P.A.

(57) ABSTRACT

Tablet press, with an upper housing part for receiving a rotor and comprising pressing tools, a lower housing part with side walls for receiving a drive device for the rotor, servo drives for peripheral apparatus for the tablet press, a switch cabinet for receiving a machine computer, electrical parts, components, such as power units with their control switches for the drive device, servo drive and peripheral apparatus, a switch cabinet housing with a rear wall, a bottom wall, a cover wall and side walls and an open front face being attached via its rear face to the outer face of a side wall of the lower housing part, furthermore with a hood which comprises hood side walls and a hood cover wall and which is pivotally mounted about a vertical axis on the switch cabinet housing or on the lower housing part by means of a hood side wall, the hood being constructed and slidable over the switch cabinet housing, in such a manner that the hood cover wall seals the front face of the switch cabinet housing and the hood side walls comprise a spacing with all the walls of the switch cabinet housing to form a ventilation duct almost completely surrounding the switch cabinet housing, furthermore with a first fan which feeds outside air into the ventilation duct via at least one inlet aperture in the hood, an outlet aperture in the hood via which the air escapes out of the ventilation duct and a second fan which circulates air in the interior of the switch cabinet housing in such a manner that it spreads along the inner face of the switch cabinet walls.

7 Claims, 1 Drawing Sheet

FOREIGN PATENT DOCUMENTS

Figure 1:
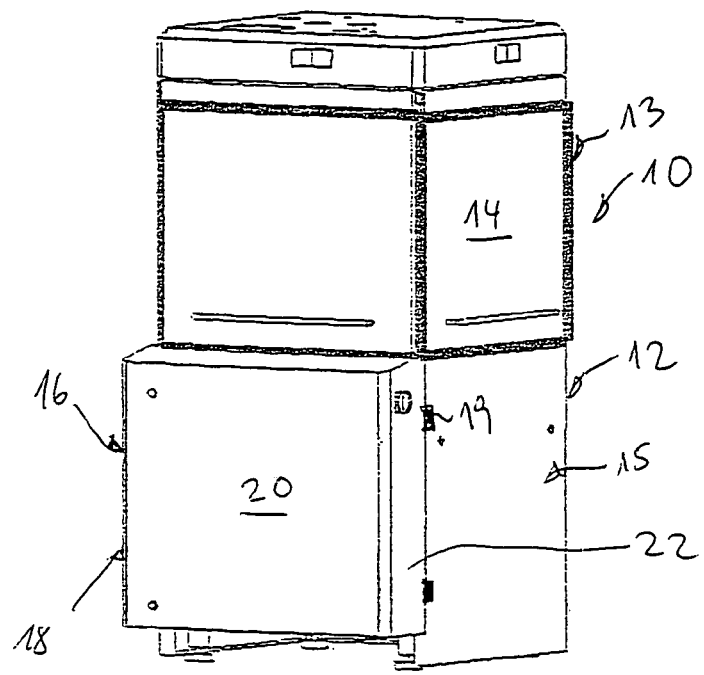

| | | |
|---|---|---|
| DE | 299 06 658 U1 | 8/1999 |
| DE | 198 12 117 A1 | 9/1999 |
| DE | 199 20 377 A1 | 11/2000 |
| JP | 03265192 A * | 11/1991 |
| WO | 02/071823 A1 | 9/2002 |

* cited by examiner

U.S. Patent     Jan. 2, 2007     US 7,158,378 B2

SWITCH CABINET FOR A TABLET PRESS

CROSS-REFERENCE TO RELATED APPLICATIONS

Not applicable.

STATEMENT REGARDING FEDERALLY SPONSORED RESEARCH

Not applicable.

BACKGROUND OF THE INVENTION

In addition to conventional rotary presses, tablet manufacturing units include further parts and peripheral apparatus. The substantial electrical and electronic components and parts for the control and regulation of the main drive of the press and the servo drive in the press and in peripheral apparatus are combined in a switch cabinet which in conventional presses is connected to the tablet press via a cable. Further parts of the unit are, as mentioned above, peripheral apparatus, such as for example dust removal devices, testing devices etc. which are connected to the switch cabinet via a terminal block of the tablet press.

The electrical components in the switch cabinet, in particular the machine computer and the power units, heat up during operation and it is necessary to provide sufficient cooling to restrict the heating. The heating naturally restricts the operating range of the entire unit. The less dissipated heat held in the switch cabinet, the more effective the heat removal from the switch cabinet and the higher the ambient temperature can be. The effectiveness of the entire unit therefore increases with the control of the dissipated heat.

Switch cabinets for tablet presses of conventional construction have ventilation with the aid of a fan to reduce the heat, which blows outside air into the housing via inlet apertures which then escapes through outlet apertures. Filter mats in the apertures ensure that no dust or other contaminants reach the switch cabinet and interfere with the operation of the electronic components and parts. It is also conceivable to add air conditioning units to the switch cabinet to restrict the temperature in the interior of the switch cabinet. With the disclosed preventative measures there is the danger that the filter and air conditioners become contaminated. Cleaning the contaminated parts proves to be difficult and costly.

The object of the invention is to create a tablet press in which the switch cabinet is integral with the press and in which heat is effectively removed to the exterior without the danger of contamination in the interior of the switch cabinet.

BRIEF SUMMARY OF THE INVENTION

According to the invention on the outer face of the switch cabinet housing receiving the electrical components and parts a ventilation duct is arranged, the inner wall thereof being formed by wall portions of the switch cabinet housing. Corresponding to the ventilation duct is a fan which feeds outside air into the ventilation duct via at least one inlet aperture, the air escaping via at least one outlet aperture. In the interior of the switch cabinet housing a second fan is arranged which circulates the air in the interior of the housing, so that it at least partially spreads along the inner face of the switch cabinet housing walls which define the ventilation duct.

The front face of the switch cabinet housing is open, a hood being provided which closes the front face with its hood cover, whilst the hood side walls extend with a spacing from the housing walls and outwardly define the ventilation duct. The rear wall of the switch cabinet housing can extend outwardly beyond the outline of the switch cabinet housing, so that the hood side walls rest against the protruding portions to seal the ventilation duct to the rear. It is also however conceivable to attach the switch cabinet housing with an open rear face against a corresponding side wall of the housing part of the press which then seals the ventilation duct to the rear.

The disclosed hood is pivotally mounted about a vertical axis on the switch cabinet housing or on the lower housing part, so that access to the interior of the housing can be easily obtained and it is possible to clean parts of the switch cabinet, in particular the heat sinks.

In the tablet press according to the invention the switch cabinet for the electronic components and parts is substantially sealed against outside air. A fan circulates air in the interior of the housing, this air however remaining in the switch cabinet housing. It comes into contact with wall portions of the switch cabinet housing which form the inner walls of the ventilation duct. Outside air flows in the ventilation duct which is naturally cooler than the air in the interior of the switch cabinet housing. Thus a heat exchange takes place via the internal wall of the ventilation duct and thus cooling of the air circulated in the interior of the switch cabinet housing. If the switch cabinet is subjected to very high external temperatures, for example when the tablet press is used in the tropics or when the tablet press is installed in very warm areas, it is also conceivable to assign a cooling system or air conditioning unit to the ventilation duct, to bring the air flowing in the ventilation duct to a lower temperature.

The heat transfer according to the invention substantially takes place via two heat transfer resistors. The heat is transferred from the internal air in the interior of the switch cabinet housing to its thermally conductive walls and from there to the outside air in the ventilation duct. Naturally the heat transfer resistance is reduced on a surface when the air speed thereon is increased. By enlarging the heat emission surface the thermal resistance can also be reduced. Thus it is advantageous when the ventilation duct covers as large a part as possible of the walls of the switch cabinet housing.

According to an embodiment of the invention, heat exchange is furthermore improved if the walls of the switch cabinet housing defining the ventilation duct are constructed as a heat sink. Thus a housing wall can for example be provided with ribs or fins, to increase significantly the transfer surface. A further improvement of the cooling according to an embodiment of the invention results from the heat sink being simultaneously a heat sink for a power unit which is directly attached to the inner face of the housing wall. The power units, for example for the main drive of the tablet press, comprise power semiconductors for operating the motor which generate a large amount of heat. It is known to attach such power semiconductors to a heat sink. These heat sinks can for their part be thus directly attached to the housing wall, which for its part can be constructed as a heat sink.

According to a further embodiment of the invention a downwardly open suction duct extends upwardly from the base of the switch cabinet housing, opposing side walls of the suction duct respectively comprising a fan which feeds air from the suction duct into the respective corresponding end of the ventilation duct. The outlet aperture is located in the upper portion of the ventilation duct. In this manner the rectangular form of the switch cabinet housing is substantially retained, a more or less large aperture being located merely on the underside, from where the suction duct upwardly extends.

DETAILED DESCRIPTION OF THE INVENTION

While this invention may be embodied in many different forms, there are described in detail herein a specific preferred embodiment of the invention. This description is an exemplification of the principles of the invention and is not intended to limit the invention to the particular embodiment illustrated FIG. 1 is a perspective view of a tablet press according to the invention with a switch cabinet attached to the front.

Figure 2:
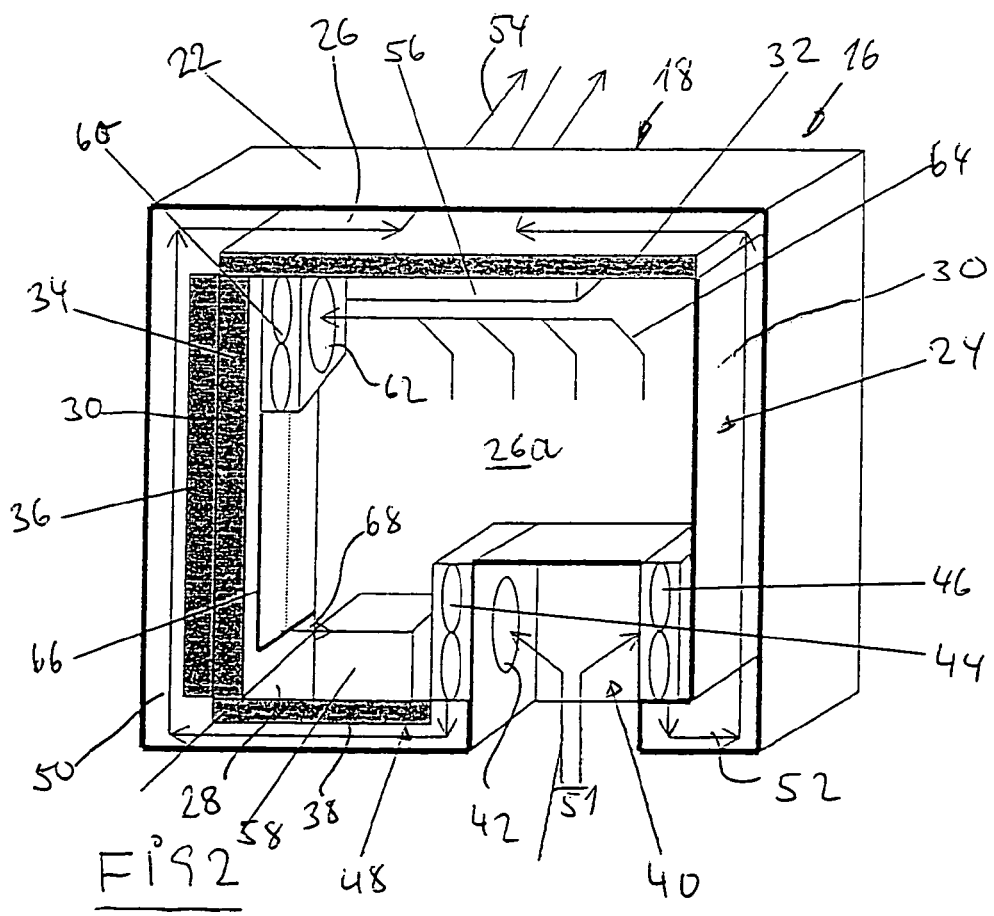

FIG. 2 shows the switch cabinet according to FIG. 1 with the front wall removed.

In FIG. 1 a rotary tablet press (10) is shown diagrammatically. It comprises a housing (12) with an upper housing part (13), the walls thereof being transparent in the upper region at (14), and a lower housing part (15). The housing part (13) houses conventional parts of a rotary press, such as a rotor, pressing tools etc and the lower housing part contains, for example drives for the rotor, peripheral apparatus etc. The individual parts are however not to be described in further detail as they are known and are not the subject of the description.

The lower housing part (15) which is rectangular in outline comprises side walls. A switch cabinet (16) is attached to the front side wall in the lower region, the construction of which is to be disclosed hereinafter with reference to FIG. 2.

The externally visible part of the switch cabinet (16) in FIG. 1 is a hood (18) with a cover part (20) and four side walls (22). The right side wall of the hood (18) is hinged to the lower housing part (15) via hinges (19) and thus pivotable about a vertical axis. In FIG. 2 only the side walls (22) of the hood (18) are visible. In FIG. 2 a rectangular switch cabinet housing (24) is further visible within the hood (18) with a closed rear wall (26a), an upper wall (26), a bottom wall (28) and side walls (30). As is visible, the wall (26) is provided with ribs (32) on the exterior. The left side wall (30) is provided with internal ribs (34) and external ribs (36). The left portion of the bottom wall (28) is provided with external ribs (38).

From the lower side wall of the hood (18) a suction duct (40) upwardly extends into the switch cabinet housing (24). The suction duct (40) is downwardly open and comprises apertures (42) in the opposing side walls, behind which a centrifugal fan (44 or 46) is respectively arranged. The outlet of the centrifugal fans (44, 46) respectively discharges into a front end of a ventilation duct (48) which is formed between the side walls (30) of the cover wall (26) and the base (28) of the housing (24) on the one hand and the inner face of the hood (18) on the other hand, which laterally encloses the housing (24) with a spacing. The cover part (20) of the hood (18) seals the open front face of the switch cabinet housing. The air sucked up by the centrifugal fans (44, 46) flows corresponding to the arrows (51) into the apertures (42) and is fed by the fans (44, 46) according to the arrows (50 and 52) through the ventilation duct (48) and discharges to the rear in the upper region of the ventilation duct as indicated by arrow (54). The outlet aperture is not visible.

A first power unit (56) is directly placed against the inner face of the upper side wall (26). A second power unit (58) is placed against the bottom wall (28) of the switch cabinet housing (24). The cover wall (26) and bottom wall (28) are cooled by the air flowing in the ventilation duct (48) via the cooling fins (32, 38), so that cooling of the power units (56, 58) results. The extent of the cooling naturally depends on the amount of air which flows through the ventilation duct (48) and on the temperature thereof.

In the upper left corner in the interior of the switch cabinet housing (24) a fan (60) is arranged which sucks air out of the interior of the housing (24) via a suction aperture (62), as indicated by the arrow arrangement (64). A baffle (66) parallel to and with a spacing from the inner face of the left side wall (30) forms an air duct which is connected to the outlet of the fan (60). The air flows downwards onto the ribs (34) and discharges toward the right above the base (28) at (68) and flows around the power unit (58) for cooling purposes. By means of the heat exchange with the ribs (34) and the heat exchange of the ribs (36) with the cool air in the ventilation duct (48) cooling of the air flowing in the interior of the housing (24) also results, whereby it cools the power parts (56, 58) shown and the remaining components and parts not shown.

Naturally the walls of the switch cabinet housing (24) are formed from thermally conductive sheet metal plates. Preferably the hood (18) also consists of thermally conductive sheet metal. If a cooling unit is used in the region of the radial fans (44, 46), the walls of the hood (18) are preferably thermally insulated.

The hood is pivotally mounted about a vertical axis to obtain access to the interior of the housing (24). In the closed state the cover portion (20) closes the front face of the switch cabinet housing (24), so that during operation it is sealed relative to the surroundings.

The above disclosure is intended to be illustrative and not exhaustive. This description will suggest many variations and alternatives to one of ordinary skill in this art. All these alternatives and variations are intended to be included within the scope of the claims where the term "comprising" means "including, but not limited to". Those familiar with the art may recognize other equivalents to the specific embodiments described herein which equivalents are also intended to be encompassed by the claims.

This completes the description of the preferred and alternate embodiments of the invention. Those skilled in the art may recognize other equivalents to the specific embodiment described herein which equivalents are intended to be encompassed by the claims attached hereto.

What is claimed is:

1. Tablet press, with an upper housing part for receiving a rotor and comprising pressing tools, a lower housing part with side walls for receiving a drive device for the rotor, servo drives for peripheral apparatus for the tablet press, a switch cabinet for receiving a machine computer, electrical parts, components, such as power units with their control switches for the drive device, servo drive and peripheral apparatus, a switch cabinet housing with a rear wall, a bottom wall, a cover wall and side walls and an open front face being attached via its rear face to the outer face of a side wall of the lower housing part, furthermore with a hood which comprises hood side walls and a hood cover wall and which is pivotally mounted about a vertical axis on the switch cabinet housing or on the lower housing part by means of a hood side wall, the hood being constructed and slidable over the switch cabinet housing, in such a manner that the hood cover wall seals the front face of the switch cabinet housing and the hood side walls comprise a spacing with all the walls of the switch cabinet housing to form a ventilation duct substantially completely surrounding the switch cabinet housing, furthermore with a first fan which feeds outside air into the ventilation duct via at least one inlet aperture in the hood, an outlet aperture in the hood via which the air escapes out of the ventilation duct and a second fan which circulates air in the interior of the switch cabinet housing in such a manner that it spreads along the inner face of the switch cabinet walls.

2. Tablet press according to claim 1, wherein the rear wall of the switch cabinet housing is formed from the corresponding side wall of the lower housing part.

3. Tablet press according to claim 1, wherein heat sinks are attached to the outer face and/or the inner face of the switch cabinet walls.

4. Tablet press according to claim 3, wherein a heat sink on the inner face of a wall of the switch cabinet housing is simultaneously a heat sink for a power unit which is directly attached to the corresponding switch cabinet housing wall.

5. Tablet press according to claim 1, wherein the switch cabinet housing and the hood are rectangular.

6. Tablet press according to claim 1, wherein a downwardly open suction duct upwardly extends from the bottom wall of the switch cabinet housing, the opposing duct side walls thereof respectively comprising a first fan which feeds air out of the suction duct into the corresponding end of the ventilation duct and the outlet aperture is arranged in the upper region of the ventilation duct.

7. Tablet press according to claim 1, wherein the hood substantially covers the corresponding side wall of the lower housing part.

* * * * *